(12) United States Patent
Van Bockstal

(10) Patent No.: US 7,659,717 B2
(45) Date of Patent: Feb. 9, 2010

(54) SENSOR FOR MEASURING MAGNETIC FLUX

(75) Inventor: Luc Van Bockstal, Leuven (BE)

(73) Assignee: Metis Instruments & Equipment N.V., Leuven (BE)

(*) Notice: Subject to any disclaimer, the term of this patent is extended or adjusted under 35 U.S.C. 154(b) by 41 days.

(21) Appl. No.: 11/667,292

(22) PCT Filed: Nov. 9, 2005

(86) PCT No.: PCT/BE2005/000163

§ 371 (c)(1),
(2), (4) Date: May 8, 2007

(87) PCT Pub. No.: WO2006/050587

PCT Pub. Date: May 18, 2006

(65) Prior Publication Data

US 2008/0007258 A1    Jan. 10, 2008

(30) Foreign Application Priority Data

Nov. 9, 2004   (GB) ................. 0424717.7

(51) Int. Cl.
*G01R 33/12* (2006.01)
(52) U.S. Cl. .......................................... 324/261
(58) Field of Classification Search ................. 324/205, 324/228, 239, 260, 261, 262, 248, 222, 207.17, 324/207.18
See application file for complete search history.

(56) References Cited

U.S. PATENT DOCUMENTS 4,523,147 A * 6/1985 D'Angelo et al. ........... 324/248
5,134,370 A   7/1992 Jefferts et al.

(Continued)

FOREIGN PATENT DOCUMENTS

EP    0 379 374 A2   7/1990

(Continued)

OTHER PUBLICATIONS

Kato Seiichi et al., Pulsed Field Magnetometer for Low-Temperature Study of High-Performance Permanent Magnets, IEEE Transactions on Magnetics, vol. 36, No. 5, Sep. 2000, pp. 3634-3636.*
Translation of official action received from Chinese Patent Office in related Chinese application (no prior art cited).

*Primary Examiner*—Kenneth J Whittington
(74) *Attorney, Agent, or Firm*—Bacon & Thomas, PLLC

(57) ABSTRACT

A sensor for measuring the magnetic flux of a sample material includes a first pick-up coil for generating a pick-up signal and a second pick-up coil for generating another pick-up signal. The first and second pick-up coils are arranged such that they have a substantially equal sensitivity with respect to a background field and a substantially equal sensitivity with respect to deviations from a central position within the coils. The coils have a different sensitivity with respect to a field generated by the sample. The sensor can be used to measure the magnetic response of magnetic material in a varying background field, e.g. for full hysteresis measurement equipment using pulsed magnetic fields. The invention also has applications in a meter for magnetic moment and in measuring induced currents in metallic samples, where it is necessary to make a measurement in the presence of an unwanted background field.

21 Claims, 6 Drawing Sheets

U.S. PATENT DOCUMENTS

| | | |
|---|---|---|
| 7,081,747 B2 * | 7/2006 | Butters et al. ............... 324/248 |
| 2002/0115571 A1 | 8/2002 | Yokosawa et al. |
| 2004/0196035 A1 | 10/2004 | Leger et al. |
| 2007/0210790 A1 * | 9/2007 | Butters et al. ............... 324/248 |

FOREIGN PATENT DOCUMENTS

| | | |
|---|---|---|
| FR | 2 687 478 | 8/1993 |
| GB | 2 382 149 A | 5/2003 |

* cited by examiner

SENSOR FOR MEASURING MAGNETIC FLUX

FIELD OF THE INVENTION

This invention relates to a sensor for measuring magnetic flux or magnetic moment. It has uses in the testing of magnetic material, to fluxmeters or meters for magnetic moment and to measuring induced currents in metallic samples.

BACKGROUND TO THE INVENTION

Permanent magnet materials are often used in devices to transform electrical energy into mechanical. In these devices, mechanical force is generated by the interaction of the magnetic field of a permanent magnet and the magnetic field generated by electrical current flowing through a coil. A typical example of such a device is a permanent magnet motor where current flowing through a winding generates a field which interacts with a field generated by a permanent magnet to drive a rotor. Another example is a loudspeaker where a winding is freely movable with respect to a permanent magnet. An amplified audio signal passes through the winding and the resulting magnetic field causes the winding and a loudspeaker cone to generate an audio signal. The permanent magnet is thus often used with a counteracting external field.

For the stability of the device, it is desirable to know that the permanent magnet material used within the device can withstand the external magnetic field without deterioration of its magnetic state. With increasing strength of the counteracting magnetic field, the magnetisation direction becomes unstable and the magnetisation will ultimately reverse. The ability to withstand an external field is described in the technical literature with a set of curves of the magnetic moment per unit volume (the magnetisation M) as a function of the magnetic field H. These curves are called hysteresis curves as they describe the memory of the magnetic state of a material and its resilience to change.

For typical applications, it is the behavior of the magnetisation combined with a counteracting magnetic field which is of importance. On the graph of magnetisation versus external field, this region of importance is located in the second quadrant. The parameter describing the magnetic field required to start reversing the magnetisation of the material is the coercive field HcJ. FIG. 1 shows the second quadrant of a typical hysteresis curve for a permanent magnetic material.

The advent of strong permanent magnetic materials such as NdFeB and SmCo created a revolution in devices because magnetic fields could be generated with significantly less material, thus saving weight and volume. Using such materials, it is now possible to produce a permanent magnet material in which the coercive field is greater than 2 MA/m.

In order to produce a hysteresis graph it is necessary to test a magnetic material by generating a magnetic field (i.e. a coercive field) over a wide range of strengths. With coercive fields above 2 MA/m, the generation of the magnetic field capable of measuring the full hysteresis curve requires special techniques. Conventional laboratory electromagnets with table-top sized iron yokes and pole shoes can achieve a field of 1.6 MA/m. Above this figure, generating the field can require in excess of 10 kW of electrical power. Superconducting magnets can achieve fields in the range 10 MA/m but they require special cryogenics. They are therefore relatively expensive in purchase and running costs. Magnetic fields generated from pulsed power supplies such as capacitor banks circumvent the need for large installed electrical power as the power is derived from an energy storage power supply. The consequence is that the pulse is limited in time by the available stored energy. Present day pulsed field installations at research facilities reach fields up to 50 MA/m and above. Laboratory equipment based on compact capacitive discharges reach fields up to 25 MA/m. In view of this, it is desirable to generate the magnetic fields required for measuring the complete hysteresis of highly coercive materials by using capacitive energy storage discharges.

One known way of measuring the magnetic moment of a sample material is to measure the magnetic flux emanating from the sample using pick-up coils. The voltage induced in the pickup coils (e.g. integrated over time) is proportional to the magnetic moment. One of the most common pick-up coil systems is the Helmholtz coil pair. The Helmholtz coil pair geometry is a special geometry for which the response is rather insensitive to the sample position, i.e. the displacement from the center position is only visible in the fourth order. Typically, the displacement can be as large as half the radius of the coils before the response changes by 1%. Higher order compensation is possible using more coils. The insensitivity to sample position of the Helmholtz coil is used both for measuring large sample sizes and for coarse sample positioning.

The Helmholtz coil is a pair of identical circular coils with a common axis. The distance of the coils is equal to the radius of the coils. Coil sets with a smaller distance have sensitivity similar to a single coil, with a maximum at the center and decreasing when moving away on the axis. The response as a function of the axial distance shows a negative second order dependence. For coil sets with a larger distance, the response is similar to the response of two independent coils, showing a maximum near the center of each coil and a minimum at the middle. Due to the increase of the sensitivity when moving away from the middle and in the direction of each coil center, the sensitivity shows positive second order dependence. FIG. 2 schematically shows the geometry of Helmholtz coils, taking a section through the coils in the half-plane. The axis of rotation is located at the left; the coils are shown as two squares. The intensity of the response is shown as a grayscale ranging from 95% to 105% with steps every 0.5%.

Alternative methods for measuring the magnetic moment are measuring the force on the sample when placed in a gradient of a magnetic field. Another method is to measure the magnetic flux density (B field) generated by the sample at a fixed position. This method is geometry dependent.

The method of measuring the magnetic moment using a Helmholtz coil pair can only be used when there is a steady background field. Due to its geometry, the Helmholtz coil pair is an even better sensor for the flux of a background field than for the flux of a magnetic sample in the center of the coils. Variations of the background field therefore generate a parasitic signal in the Helmholtz coil pair, or in any coil. However, as explained above, the high coercive field needed to generate a full hysteresis curve requires techniques for which the background field is not constant.

For measurement of the magnetic moment in a changing background field, compensation techniques are required for any method based on the inductive measurement. Compensation would be based on the use of two coil sets with different response: one coil set to measure the more of response of the sample and the other coil set to measure more of the response of the background field. The proper signal of the sample needs to be reconstructed by subtracting the latter from the first. However, if the first set would have Helmholtz geometry, the signal of the second set would be sensitive to the position of the sample. The difference of both signals would show increased position sensitivity.

U.S. Pat. No. 5,134,370 describes an apparatus for detecting the presence of a magnetic tag in a specimen. The apparatus comprises a plurality of magnetic field detecting coils which have outputs balanced against one another in a uniform magnetic field and in some instances also balanced in a field with uniform gradient. The coils are separated from one another so that at least one coil is disposed closer to the specimen under test than at least a second coil. The apparatus measures gradient of nearby source and the compensation technique is to balance in uniform background field. Measurement of gradient makes the sensor sensitive to the position of the sample under test. The coils are moved past the stationary specimen under test. If a tag is present in the specimen in the area under examination, the multiple coils will detect different magnetic fields. The output of the balanced coils system will no longer indicate cancelled fields. Instead, the coils will indicate the detection of a difference between the magnetic fields which effect the different coils. Once the difference is detected, a signal is generated to advise the user of the existence of the additional magnetic field and thus the existence of the magnetic tag in the specimen in question.

GB 2 382 149 provides a method for measurement of desired magnetic gradients from a far target source based upon direct magnetic gradiometers, where an immunity to near noise-like magnetic signals is provided. The gradiometer comprises two first direct magnetic gradiometers placed side by side and having their sensitivity axes aligned along a same x-direction in order to distil near signals from far signals and a complementary pair of direct magnetic gradiometers placed along a y-direction. Each of the four direct magnetic gradiometers is placed vertically and measures one of the off-diagonal components of the magnetic gradient tensor. By differencing the output of the two first direct magnetic gradiometers an output signal containing information on the near signals but not on the far signals is obtained. The device according to GB 2 382 149 measures a gradient of a nearby source and the compensation technique is balanced using a (uniform) reference signal.

US 2004/0196035 describes a magnetometer in which structure dissymmetries, such as irregularities of the diameter of the wire or the turns, or even the number of turns, between the windings in a receiver coil or their relative positions with respect to excitation coils that have an influence on the mutual inductance between the excitation and induction coils, are corrected. The magnetometer according to US 2004/0196035 measures a gradient of a nearby source and the compensation is performed electronically.

Up to now, no sensor was developed which shows both proper background compensation and the position insensitivity of the Helmholtz coil pair.

The present invention seeks to improve the accuracy of measuring the magnetic flux or moment of a sample, particularly in a varying background field.

SUMMARY OF THE INVENTION

An object of the present invention is to provide methods and apparatus to improve measurement of the magnetic flux or moment of a sample, particularly in a varying background field.

A first aspect of the present invention provides a sensor for measuring the magnetic moment of a sample material comprising two or more pick-up coils for generating a pick-up signal and means for combining of the pick-up signals to thereby yield a significantly zero sensitivity with respect to a background field and a significant sensitivity with respect to the field generated by the sample material, characterised by the means for combining of the pick-up signals also yielding a significantly zero sensitivity with respect to deviations of a sample material from a central position within the coils.

A combination of the pick-up signals from the two coils yields a low or significantly zero sensitivity with respect to a background field. The background field is compensated for by the arrangement of the two coils and by the combination of the pick-up signals from the coils. For example, a resulting sensitivity to the effect of the background field is less than 10% or less than or equal to 1 part in a thousand of the individual measured signals from one of the pick up coils can be obtained. Further, the coil arrangement has a low or significantly zero sensitivity with respect to deviations of a sample to be measured from a central position within the coils. A resulting sensitivity can be less than 20% and less than 2% and up to 1% of the individual signals for a typical deviation from the center of ½ of the radius/dimension of the test zone, that is typically the radius of the main pick up coil. A significant sensitivity with respect to the field generated by the sample is also achieved. The signal related to the measured sample is preferably more than 5% and up to 50% or more of the individual signals obtained from one of the pick-up coils, i.e. if the compensation mechanism of the present invention were not there.

The present invention also provides: a sensor for measuring the magnetic moment of a sample material or the magnetic flux it generates, the sensor comprising:

a first pick-up coil for generating a pick-up signal; a second pick-up coil for generating another pick-up signal; wherein the first and second pick-up coils are arranged such that they have a substantially equal sensitivity with respect to a background field, a substantially equal sensitivity with respect to deviations of a sample from a central position within the coils and a different sensitivity with respect to a field generated by the sample.

A sensor of this kind has the same advantages and similar sensitivity with respect to positioning sensitivity as a Helmholtz coil pair while also having the additional advantage that the background signal is compensated. These properties make the sensor well-suited to measuring the magnetic response of magnetic material in a varying background field, e.g. for full hysteresis measurement equipment using pulsed magnetic fields. For example, the background field can be a pulsed field of 0.25 Tesla or more, 1 Tesla magnitude or more or 5 Tesla or more. Such large magnitude pulsed fields have the advantage that large fields can be obtained to drive very hard materials around a hysteresis loop. They have the disadvantage that the pulsed field can induce large EMFs which need to be compensated. The invention also has applications in a fluxmeter or meter for magnetic moment and in measuring induced currents in metallic samples, where it is necessary to make a measurement in the presence of an unwanted background field.

A second aspect of the invention provides a test apparatus for testing a sample of magnetic material, the test apparatus comprising a generator for generating a varying magnetic field within a test zone and a sensor of the above type, with the at least first and second pick-up coils being positioned within the test zone.

The present invention also provides a test apparatus for testing a sample of magnetic material, the test apparatus comprising:

a test zone with an unknown magnetic background field and a sensor as defined above being positioned within the zone.

The test apparatus comprises:

a generator for generating a varying magnetic field within a test zone, a sensor according to embodiments of the present invention with the pick-up coils being positioned within the test zone.

The present invention also provides a magnetic open loop test arrangement, i.e. a test apparatus for testing a sample of magnetic material, the test apparatus comprising:

a sensor as described above being positioned within a test zone, the region around the test zone being significantly free of auxiliary magnetic material for guiding the magnetic flux generated by the sample. Accordingly, the arrangement can be in an open magnetic loop with significant air gaps between the pick-up coils and the sample.

The coil arrangement can be made without using magnetic pole shoes for the test zone. The coils are arranged in such a way that the combined signal is significantly dependent on the magnetic moment of the sample and significantly independent of the geometry of the sample.

The present invention also provides a test apparatus for testing a sample of magnetic material, the test apparatus comprising: a generator for a magnetic field substantially larger than 0.25 Tesla in a test zone and a sensor as defined above being positioned within the zone.

Any of test apparatus above may comprising a data analysis function which is operable to obtain a hysteresis curve of the sample material.

The present invention also provides a method of designing a sensor having two or more pick-up coils mounted coaxially with one another along an axis, each pick-up coil comprising a set of windings spaced apart along the axis comprising:

determining a geometrical arrangement of the pick-up coils by using numerical modeling of the magnetically induced pick-up signal in order to eliminate the effects of the background field and the dependency of the sample position from a central position within the coils, and making the coils in accordance with the determined geometrical arrangement.

The present invention will now be described with reference to the following drawings.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
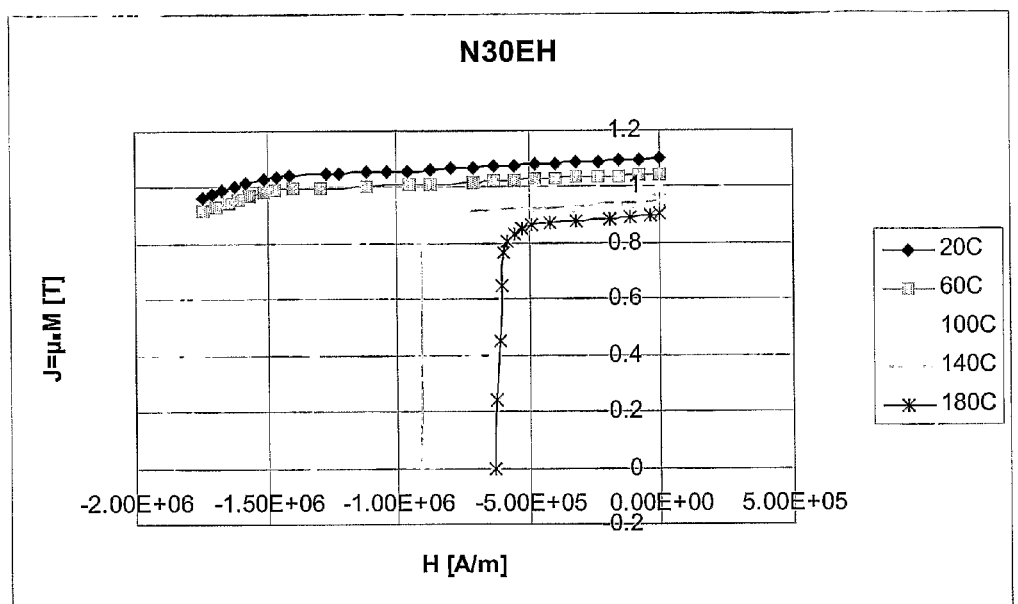
FIG. 1 shows an example of a hysteresis curve for a permanent magnetic material.
Figure 2:
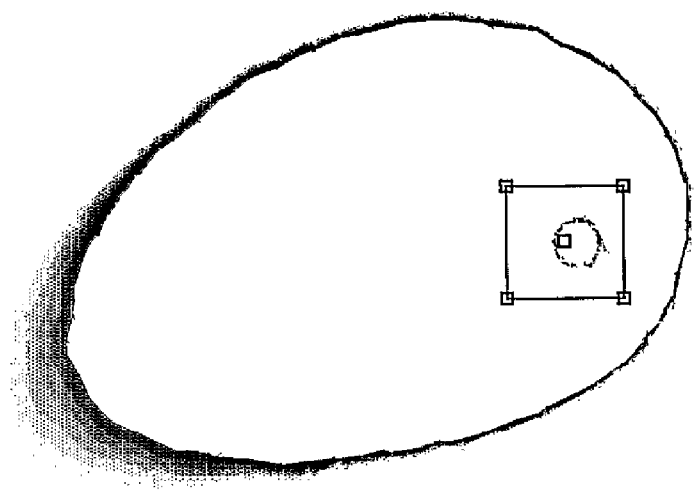
FIG. 2 shows the sensitivity of a Helmholtz coil.
Figure 2:
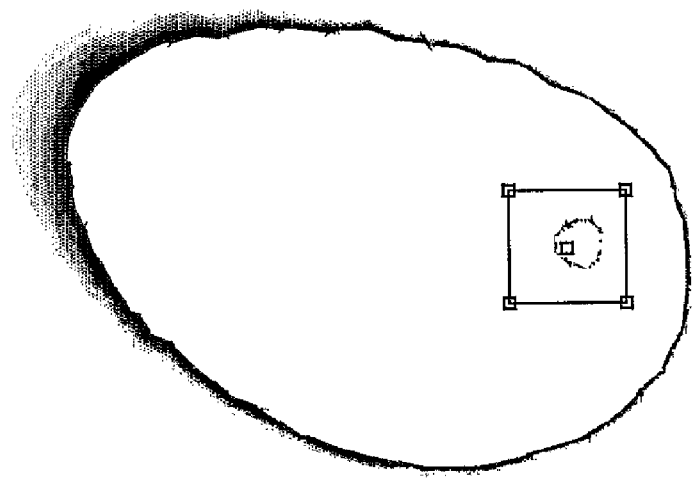

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

The present invention will mainly be described with reference to the testing of hard magnetic materials, i.e. ones with a significant area to the hysteresis loop. Also these magnetic materials will have significant remanance and coercive force. The saturation fields for such materials will typically be in excess of 0.25 Tesla, e.g. 0.5 Tesla or more, e.g. 1 Tesla, or more of for example 5 Tesla or more.

Figure 3:
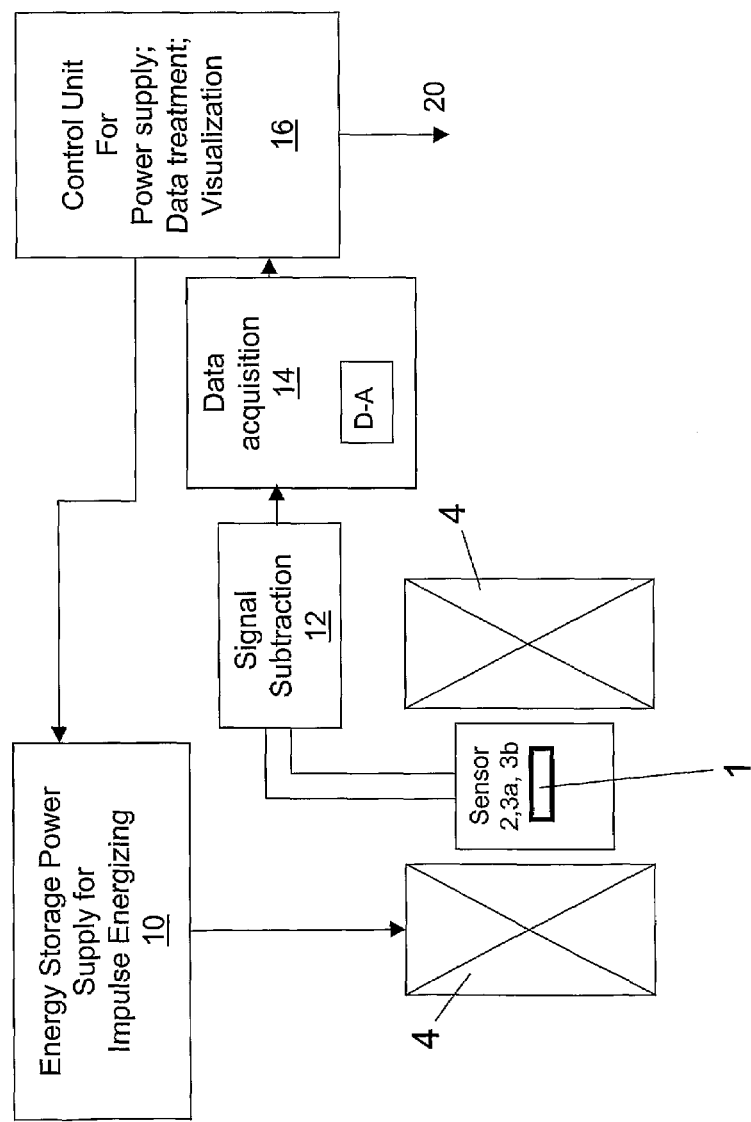
FIG. 3 shows an overall test apparatus for measuring the magnetic moment of a sample in the presence of a magnetic field in accordance with an embodiment of the invention.
Figure 4:
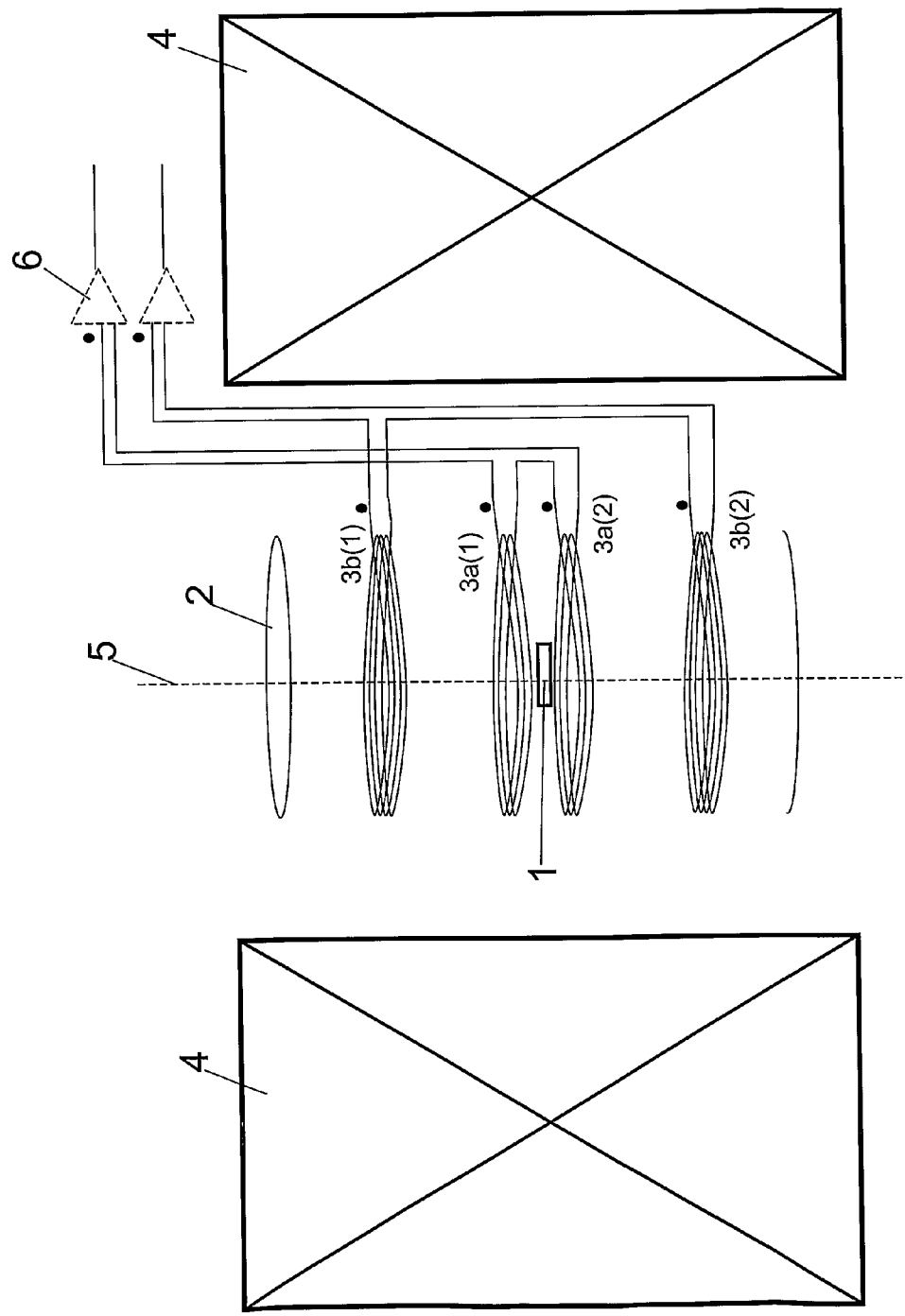
FIG. 4 shows the pick-up coils used in the sensor of FIG. 3 in more detail.

FIGS. 3 and 4 show an embodiment of a test apparatus for measuring the magnetic moment of a sample of permanent magnetic material within a background magnetic field. FIG. 3 shows the overall apparatus and FIG. 4 shows a more detailed view of the test zone and sensor coils. A sensor for measuring the magnetic flux of a sample material comprises two or more pick-up coils $3a$ and $3b$ for generating a pick-up signal. The pick-up coils $3a$, $3b$ are arranged such that the linear combination of the signals has a negligible sensitivity with respect to a background field and a negligible sensitivity with respect to deviations from a central position within the coils. The coils have a significant sensitivity with respect to a field generated by the sample. The sensor can be used to measure the magnetic response of magnetic material in a varying background field, e.g. for full hysteresis measurement equipment using pulsed magnetic fields. The invention also has applications in a meter for magnetic moment where it is necessary to make a measurement in the presence of an unwanted background field.

A large coil 4, such as a solenoid, is connected to an energy storage power supply 10 which is capable of generating a pulsed magnetic field at coil 4. For example, the field can be a pulsed field of 1 Tesla magnitude or more or 5 Tesla or more. This magnetic field will be referred to as a background or coercive field. In use, the area within coil 4 is exposed to the pulsed magnetic field. Positioned within the coil 4 is a hollow cylindrical support 2. Support 2 has a diameter which is sufficient to accommodate a test sample 1. Typically this will be a length of permanent magnetic material. Two coils $3a$, $3b$ are mounted on the support 2. The magnetic arrangement is an open magnetic loop in that there are significant air spaces between the sample and the coils. The arrangement can be made without using magnetic pole pieces for the test zone.

A first coil $3a$ comprises a first set of windings $3a(1)$ and a second set of windings $3a(2)$ which are spaced apart along the axis 5 of the support 2. The two sets of windings are connected in series with one another. A second coil $3b$ also comprises a first set of windings $3b(1)$ and a second set of windings $3b(2)$ which are spaced apart along the axis 5 of the support 2. The two sets of windings are also connected in series with one another. Windings $3b$ are mounted on each side of windings $3a$ so that the windings $3b$ are further from the test sample 1 than windings $3a$. The coils shown in FIG. 4 have a circular cross-section although this is not essential and the cross-section can take other shapes such as a square.

This arrangement of coils $3a$, $3b$ has the effect that:
the coils have an equal sensitivity with respect to the background field generated by coil 4 during a test sequence;
the coils have a different sensitivity with respect to the signal representing flux generated by the sample 1;
the coils have an equal sensitivity with respect to small deviations of sample 1 from the centre position of the array of coils.

The requirement for equal sensitivity to the background field can be met in a uniform background field by making the product of (number of turns × area of coil) for each coil $3a$, $3b$ equal. It should be noted that the sensitivity of a coil may be equal or (different) to that of another coil either by virtue of the coil's properties such as size or position with respect to the sample or background field, or by the use of an amplifier placed after the coil, shown as element 6 in FIG. 4. For example, an amplifier 6 may boost the amplitude of a signal from coil 3a so that, after amplification, a particular signal component (such as the background field) appears at the same amplitude as the same component in the signal from coil 3b.

Each pick-up coil 3a, 3b produces a signal which is an induced voltage arising from the flux passing through that coil. The induced voltage will include a component due to the background field and a component due to the field generated by sample 1. As coils 3a and 3b have equal sensitivity with respect to the background field, the components in signals from coils 3a, 3b due to the background field should be equal. The positioning of coil 3b further from the sample 1 than the coil 3a ensures that the component due to the flux generated by the sample 1 will be different in signals 3a, 3b. The signals from windings 3a, 3b are subtracted from one another. Signal 3b can be subtracted from signal 3a. The equal (or near equal) components due to the background field will cancel one another. Deviation of the position of sample 1 from a central position within the support 2 will generate a substantially equal component in signals from coils 3a, 3b and consequently subtraction of signals 3a, 3b will cancel the effect of the sample deviating from a central position. The overall effect of the subtraction is that the resulting signal is immune to the background field and the small deviations from the center position of the sample.

The determination of the position of the coils 3a and 3b can be done in several ways. The simplest procedure is to determine numerically the flux generated in the coils at different positions along the axis. In order to achieve compensation for the background field, the ratio of the number of turns in the coils is inversely proportional to the flux in the coils, the winding direction being opposite. For a possible coil set, the sensitivity to sample position is then calculated numerically, e.g. by finite difference or finite elements methods suitable for the calculation of magnetic fields. Such general methods are well known, see for example: "Analysis and Computation of Electric and Magnetic Fields," K. J. Binns and P. J. Lawrenson, Pergamon Press, 1973, "Numerical Analysis," R. L. Burden and J. D. Faires, seventh ed. Wadsworth Brooks/Cole 2001, "The finite element Method" O. C. Zienkiewicz and R. L. Taylor, fifth ed. Butterworth-Heinemann, 2000. The final position of the coils is then determined by iteratively changing the geometrical position of the pick-up coils in order to achieve the desired compensation for the sample position. Typically a software search routine is written to iteratively change the position of the coils and then to calculate values of parameters related to the sensitivities. From the obtained values, certain arrangements may be selected to provide first optimized positions followed by further fine grained position optimizations to obtain better results. A suitable initial coil position can be the inner coils arranged at the Helmholtz coil distance and the outer coils arranged at twice the Helmholtz coil distance. From this initial state the positions are varied iteratively. The aim of these iterations is to arrange the coils so that that the background field is compensated for by the arrangement of the two coils and by the combination of the signals from the coils. For example, the coils may be arranged by the above method so that a resulting sensitivity to the effect of the background field is less than 10% or less than or equal to 1 part in a thousand of the individual measured signals from one of the pick-up coils can be obtained. Further, the coil arrangement can be positioned so that there is also a low or significantly zero sensitivity with respect to deviations of a sample to be measured from a central position within the coils. A resulting sensitivity can be less than 20% and less than 2% and as low as 1% of the individual signals from one of the pick-up coils for a typical deviation from the center of ½ of the radius/dimension of the test zone, that is typically the radius of the main pick up coil. A significant sensitivity with respect to the field generated by the sample is also achieved, i.e. to obtain a good signal to noise ratio. The signal related to the measured sample can be arranged so that it is preferably more than 5% and up to 50% or more of the individual signals from one of the pick-up coils, i.e. if the compensation mechanism of the present invention were not there. Further all the above signals can be measured independent of the geometry of the sample. Due to the fact the measurement arrangement is in an open magnetic loop the exact shape or dimensions of the sample are not critical.

The amount of coils can be increased to obtain compensation for the sample position over a larger range.

The subtraction of signals from coils 3a, 3b can be achieved in several ways. In it's simplest form, the windings can be connected in such a way that the sense of one signal is opposite to the sense of another. The sense of the signals is shown in FIG. 4 in the conventional manner using the dot notation. This will directly subtract the signals from one another. Alternatively, the subtraction can be achieved in the analogue domain by electrically subtracting the signals. In a further alternative, each signal is separately sampled by an analogue-to-digital converter in block 14 to provide a digital representation of the signal. The digital signals can then be manipulated in the digital domain, by numerically subtracting them. Regardless of how the signals are combined, the signals will be sampled in data acquisition block 14 and then processed in data treatment function 16 to generate a hysteresis curve of the type shown in FIG. 1. The processed data can be output 20 to storage or to other apparatus. Control function 16 also co-ordinates control of the energy storage supply 10 to generate a pulsed signal at an appropriate time. The processing of blocks 12, 14 and 16 can be performed by a standard personal computer with suitable software and an interface to sample the individual signals from coils 3a, 3b, or a combination of signals 3a, 3b.

Although not shown in FIG. 3, a sample holder may additionally be provided within the support 2, aligned coaxially with the central axis of the support 2 and preferably also centrally within the array of coils 3a, 3b. The sample holder would be of a sufficient size to accommodate the expected range of sizes of test sample. As explained above, the sensor can cope with small deviations of the test sample from a truly central position within coils 3a, 3b and so it is not essential that the sample is placed centrally within the sample holder.

The above sensor therefore has the same advantages with respect to positioning sensitivity as the Helmholtz coil pair while having the additional advantage that the background signal is compensated. These properties make the sensor well-suited to measuring the magnetic response of magnetic material in a background field, e.g. for fall hysteresis measurement equipment using pulsed magnetic fields.

Figure 5:
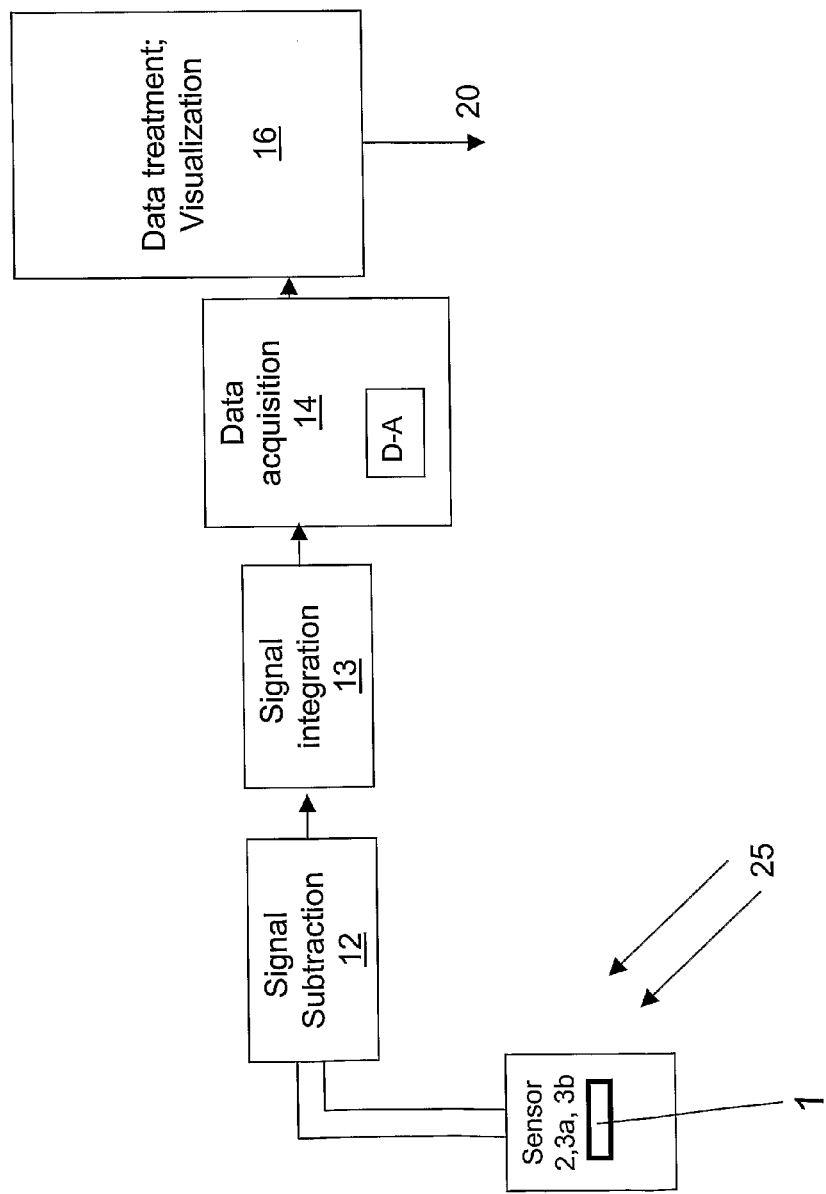
FIG. 5 shows an alternative embodiment for use as a fluxmeter.

While the sensor is particularly useful for measuring the magnetic response of a magnetic material in a background field, it can also be used as a fluxmeter. Referring to FIG. 5, the apparatus uses the same arrangement of support 2, coils 3A, 3B as shown in FIG. 3, and much of the same downstream data processing functions. However, the background field 25 is not provided by an artificially generated field 4, but by the background environment in which the wanted flux (e.g. of a test sample 1) is being measured. The sensor can also be used generally to measure induced currents in a metallic sample 1.

Figure 6:
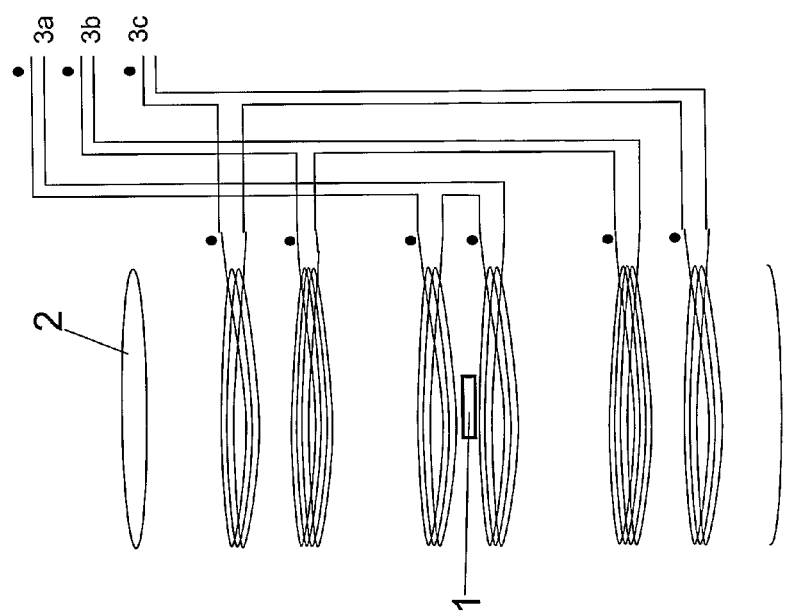
FIG. 6 shows the use of additional sets of pick-up coils.

Referring to FIG. 6, additional coils can be added to provide further advantages. Each additional coil set has a different response to the sample, background field, 2nd order sample position, 4th order sample position, axial inhomogeneity of the background field, radial inhomogeneity of the background field, or 2nd and 4th order position of the center of the background field. With each additional set of coils, one additional parameter can be compensated for.

In accordance with the present invention a combination of the signals from the pick-up coils is made—typically this will be a linear combination of the signals. As an example, the signal from a coil i (which may include several separate coils connected in series) is Si.

$$S_i = a_i M + \sum_j b_{ij} D_j$$

where M is the magnetisation, ai the responsivity, Dj the effects to be compensated for and bij the respective responsivities to these effects. By the use of additional coils signals are added with respective coefficients ci and the effects Dj to be compensated for are cancelled:

$$S_{compensated} = \sum_i c_i S_i = \sum_i c_i a_i M + \sum_j \sum_i c_i b_{ij} D_j$$

$$\forall j : \sum_i c_i b_{ij} = 0$$

Any of test apparatus above may comprising a data analysis function which is operable to obtain a hysteresis curve of the sample material. The invention is not limited to the embodiments described herein, which may be modified or varied without departing from the scope of the invention.

The invention claimed is:

1. A sensor for measuring the magnetic moment of a sample material comprising:
   two or more pick-up coils for generating pick-up signals, wherein said pick-up coils comprise a first pick-up coil having a first set of windings and a second pick-up coil having a second set of windings, said first and second sets of windings being spaced apart from one another along an axis of the coils, the windings of one of the second pick-up coil being positioned outside the windings of the first pick-up coil, wherein:
      said first and second pick-up coils are arranged to have an equal sensitivity with respect to a background field; and
      said first and second pick-up coils are arranged to have a different sensitivity with respect to a field generated by the sample material positioned inside said first set of windings; and
      said first and second pick-up coils are arranged to have an equal sensitivity with respect to deviations of the sample material from a center position of the first and second pick-up coils; and
   signal combining means for combining signals picked-up by said first and second sets of pick-up coils such that:
      since said pick-up coils have an equal sensitivity with respect to said background field, background signal components due to the background field will cancel each other;
      since said pick-up coils have a different sensitivity with respect to the field generated by the sample material, sample field signal components due to the field generated by the sample material will yield a difference signal indicative of said field; and
      since said pick-up coils are arranged to have an equal sensitivity with respect to deviations of the sample material from the center position, differences in said sample material signal components resulting from deviations from center will cancel each other.

2. The sensor according to claim 1, wherein the pick-up coils and the sample material are arranged in a magnetic open loop arrangement.

3. A sensor according to claim 1, wherein the two or more pick-up coils include first and second pick-up coils that are arranged such that they have a substantially equal sensitivity with respect to a background field, resulting in a sensitivity of the combined signal with respect to a background field of less than 10%, or 1 part in a thousand of a signal from one of the pick-up coils.

4. The sensor according to claim 1, wherein the two or more pick-up coils include first and second pick-up coils that are arranged such that they have a substantially equal sensitivity with respect to deviations of the sample from a central position within the coils, resulting in a sensitivity of the combined signals with respect to the position of the sample material of less than 20%, less than 2% or 1% of the signals from one of the pick-up coils for a typical positional deviation from the center of ½ of a radius of a test zone of the sensor.

5. The sensor according to claim 1, wherein the two or more pick-up coils include first and second pick-up coils that are arranged such that a sensitivity of the combined signals with respect to the field generated by the sample is better than 5% and up to 50% of a signal from one of the pick-up coils.

6. The sensor according to claim 1, wherein the product of the area of the coil and the number of turns of the coil, for each of the pick-up coils, is substantially equal.

7. The sensor according to claim 1, wherein the pick-up coils are spaced apart along an axis.

8. The sensor according to claim 7, wherein all of the coils are mounted coaxially with one another along the axis.

9. The sensor according to claim 7, wherein all of the coils are of equal area.

10. The sensor according to claim 1, wherein the pick-up coils are mounted coaxially with one another along an axis and each of the two or more pick-up coils comprises a set of windings which are spaced apart from one another along the axis, a first set of windings of the one pick-up coil being positioned outside of a second set of windings of the other pick-up coils so that the first set of windings is further from the sample material than the second set of windings.

11. The sensor according to claim 1, wherein the coils are arranged in such a way that the combined signal is significantly dependent on the magnetic moment of the sample material and significantly independent of the geometry of the sample material.

12. The sensor according to claim 1, wherein the signal combining arrangement is operable to subtract one of the pick-up signals from the other of the pick-up signals.

13. The sensor according to claim 12, wherein the signal combining arrangement comprises a connection between the first and second pick-up coils such that the sense of one pick-up signal is opposite to the sense of the other pick-up signal.

14. The sensor according to claim 12, wherein the signal combining arrangement comprises an electrical circuit which acts on the pick-up signals in the analog domain.

15. The sensor according to claim 12, including an analog-to-digital converter which is operable to sample the pick-up signals to create a pair of digital data signals and wherein the signal combining arrangement is operable to act on the digital data signals.

16. The sensor according to claim 1, including additional sets of pick-up coils.

17. The sensor according to claim 1, including an integrator for integrating a combination of the pick-up signals over a period of time.

18. A test apparatus for testing a sample of magnetic material, the test apparatus comprising:
   a generator for generating a varying magnetic field within a test zone;
   a sensor according to claim 1 with the pick-up coils being positioned within the test zone.

19. The test apparatus according to claim 18, wherein the generator generates a pulsed magnetic field.

20. The test apparatus according to claim 19, including a data analysis function which is operable to obtain a hysteresis curve of the sample.

21. The sensor according to claim 1, wherein geometrical positions of said coils are determined by first determining numerically the flux generated in the coils at different positions along the axis, and then iteratively changing the geometrical positions in order to achieve a desired compensation for sample position.

* * * * *